United States Patent
Honsberg-Riedl et al.

(10) Patent No.: US 6,245,187 B1
(45) Date of Patent: *Jun. 12, 2001

(54) MECHANICALLY FIRM GLUED CONNECTIONS BETWEEN SURFACES AND THE METHOD FOR PRODUCING THE SAME

(75) Inventors: Martin Honsberg-Riedl, Bad Reichenhall; Daniel Seeberger, Munich; Klaus Hoehn, Taufkirchen; Volker Plickert, Brieselang, all of (DE)

(73) Assignee: Siemens Aktiengesellschaft, Munich (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/869,669

(22) Filed: Jun. 5, 1997

(30) Foreign Application Priority Data

Jun. 5, 1996 (DE) .............................. 196 22 684

(51) Int. Cl.⁷ ..................................... C09J 5/00
(52) U.S. Cl. ..................... 156/305; 156/295; 428/166
(58) Field of Search ................... 156/305, 295; 428/166

(56) References Cited

U.S. PATENT DOCUMENTS

| | | | |
|---|---|---|---|
| 3,355,341 | * 11/1967 | Bertsche | 156/295 |
| 4,042,434 | * 8/1977 | Ivanko | 156/305 |
| 4,817,277 | 4/1989 | Hieber et al. | |
| 5,133,746 | * 7/1992 | Brady et al. | 156/305 |
| 5,273,606 | * 12/1993 | Greve et al. | 156/305 |
| 5,779,837 | * 7/1998 | Harvey | 156/295 |
| 5,855,713 | * 1/1999 | Harvey | 156/324.4 |
| 5,951,813 | * 9/1999 | Warren | 156/305 |

FOREIGN PATENT DOCUMENTS 0 237 114   7/1992   (EP) .

OTHER PUBLICATIONS

Pape, "Elektrische Kontakte, hergestellt mit nichtgefüllten Klebstoffen", *Elektronik Produktion & Pruftechnik*, May 1989, pp. 40–44. Untranslated.

Köhler et al, "3.3 Technische Oberflächen", *Maschinenteile 1*, Teubner–Verlag 1986, pp. 74–77. Untranslated.

* cited by examiner

*Primary Examiner*—John J. Gallagher
(74) *Attorney, Agent, or Firm*—Schiff Hardin & Waite (57) ABSTRACT

To produce a mechanically firm glued connection between two surface regions of surfaces to be connected, a method is provided which provides each of the surfaces with surface regions having a peak-to-valley thickness of less than 0.3 $\mu$m and the surface regions are brought together in such a way that an intermediate space, which is filled with the glue, is produced therebetween and the space has a small average thickness of less than 0.31 $\mu$m and extends over a surface area of at least 20×20 $\mu m^2$. The glue is preferably brought into the intermediate space by capillary action and contacts of high quality can be achieved with this method.

24 Claims, 4 Drawing Sheets

MECHANICALLY FIRM GLUED CONNECTIONS BETWEEN SURFACES AND THE METHOD FOR PRODUCING THE SAME

BACKGROUND OF THE INVENTION

The present invention is directed to a mechanically firm glued connection between surfaces and a method for producing the connection.

A method for producing mechanically firm glued connections between surfaces, with each of the surfaces to be connected having at least one surface region that extends over the surface and comprises a roughness with a small peak-to-valley height t and is provided for the production of a glued connection having the steps of setting the surface regions having the small peak-to-valley height opposite one another with the intermediate space between these surfaces extending in a planar direction over the surface and having a small average thickness, providing a hardenable glue having a low viscosity and then hardening the glue contained in the intermediate space to essentially maintain the small average thickness of the intermediate space was disclosed, for example, in *Elektronik Produktion und Prüftechnik,* May 1989, pages 40–44. In this known method, the surface regions of the surfaces to be connected, which regions extend over a surface and are provided for the production of a glued connection, comprise a small peakto-valley height of from 0.5 $\mu$m to about 2 $\mu$m. The connecting glue layer, consisting of a hardenable glue, is provided in the intermediate space between the surface regions comprising a thickness of 0.5 $\mu$m to 1 $\mu$m.

In an embodiment of this known method, the surface regions provided for the production of the glued connection are first placed together, and the low-viscosity glue consisting of a cyanoacrylate is subsequently brought into the intermediate space by means of the surface tension.

In another embodiment of this invention, a glue drop made of epoxy is first deposited on one of the surfaces to be connected using an extruder, and the other surface is then applied with a pressure of 30 cN/mm$^2$. With this known method, it is possible to produce conductive glued connections with glues that are non-filled, for example glues which are electrically insulating.

U.S. Pat. No. 4,817,277, whose disclosure is incorporated herein by reference thereto and which claims priority from the same German Application as European 0 237 114, discloses a method for producing an electrically conductive glued connection between electrically conductive parts, whose surfaces to be glued likewise comprise a surface roughness with a peak-to-valley height. In this known method, the surfaces to be connected are, respectively, provided with a layer of at least one transition element of a first and/or second transition series of the periodic table of the elements, which provides a peak-to-valley height in the $\mu$m range. For the production of the glued connection, an electrically non-conductive glue is used in such a quantity that the raised regions of the transition element layers still achieve contact with one another. The peak-to-valley heights used in this method amount to a few 0.1 $\mu$m, with the use of copper as a transition element, and are larger, for example around 1 $\mu$m, given the use of other transition elements. A desired peak-to-valley height can be achieved using an ion etching process. The glue is deposited on one of the surfaces to be connected by a thin brushing, and can consist, among other things, of an adhesive paint based on the cyanoacrylate, epoxy resin or polyester. The transition resistance of the glued connections produced according to this method is in the range of 3 to 9 m$\Omega$/mm$^2$ of the contact surface given simultaneous mechanical and thermal loading.

To produce an electrically conductive glued connection between an electronic or, respectively, a microelectronic module and a substrate element, the Japanese company Matsushita uses a gluing method with an electrically insulating glue, in which the surface of the module that is to be connected with the surface of the substrate element comprises, for example, humps or bumps made of gold with a height of at least 3 $\mu$m and a surface of 251 $\mu$m, and the humps or bumps are arranged with a 10 $\mu$m grid.

For the production of the glued connection, the surface of the substrate element provided with the terminals is coated with an electrically insulating glue that hardens in a UV light and that shrinks when it hardens.

The surface of the module provided with the humps and the surface of the substrate element provided with the terminals are positioned opposite one another in such a way that each hump of the module respectively lies opposite a terminal of the substrate element.

After this, the two surfaces are pressed against one another with a pressure, for example 1.5 to 3 cN/25 $\mu$m$^2$ and are exposed to ultraviolet light, for example for 3 seconds at 1 mW/cm$^2$.

By means of the shrinkage tension that occurs during the hardening of the glue, the humps or bumps and terminals lying opposite one another are permanently pressed against one another so that no electrically effective barrier layer arises (transition resistance 18 m$\Omega$). A high reliability also occurs with respect to shock, for example thermal cycling between $-55°$ C. and $125°$ C. with 1000 cycles, a temperature storage of 1000 hours at $125°$ C. and a humid heat at $85°$ C. with 85% humidity for 100 hours.

Glass, ceramic and hard substrate elements can be used as the substrate elements.

With this method, it is possible to realize LED arrays with IC control, comprising 7 $\mu$m-high humps arranged in a grid of 63.5 $\mu$m and 100 $\mu$m.

SUMMARY OF THE INVENTION

The object of the present invention is to provide a method in which durable, mechanically firm glued connections between surfaces can be achieved with a minimal outlay of glue.

This object is obtained by means of an improvement in a method for producing mechanically glued connections between surfaces, in which the surfaces to be connected comprise at least one surface region that extends over a surface and comprises a roughness with a small peak-to-valley height t and is provided for the production of glued connections and having the steps of positioning the surface regions having the small peak-to-valley height and which are to be connected to one another opposite one another with an intermediate space being between the surface regions being planarly extended over the surface and having a small average thickness for receiving the glue, which has a low viscosity, and subsequent hardening of the glue contained in the intermediate space while maintaining a small average thickness of the intermediate space. The improvements are that the surface regions provided for the production of the glued connections respectively comprise a peak-to-valley height t of less than 0.3 $\mu$m and the intermediate space that is filled with glue comprises a small average thickness d of less than 0.3 $\mu$m and extends over a surface that is at least an area of 20×20 $\mu$m$^2$ in size.

The invention is based on the new and surprising find that mechanically firm and sufficiently durable glued connections occur between surfaces, despite small peak-to-valley heights of less than 0.31 µm and a planarly extending intermediate space available for gluing with a small average thickness of less than 0.3 µm.

A particularly preferred and advantageous construction of the inventive method is that the spreading of the thin glue with a dynamic viscosity low enough that, due to capillary action, the glue will spread in a planar fashion in the intermediate space between the small average thickness of less than 0.3 µm.

It has thus turned out that there is no lower limit to the small peak-to-valley height and the small average thickness of the intermediate space, so long as an intermediate space remains between the surface provided for the production of the glued connection, which space can receive sufficiently thin liquid glue as a result of capillary action and allows a planar spreading of this glue in this intermediate space. Allowable peak-to-valley heights and an average thickness of this sort lie well below 0.21 µm and even well below 0.1 µm.

The term "peak-to-valley height" refers to the spacing of the base profile from the reference profile of the rough surface region provided for the production of the glued connection, for example, see Kohler et al, *Maschinenteile* 1, Teubnerverlag, 1986, page 75. The term average thickness of the intermediate space here refers specifically to the spacing between the average profiles of the two surface regions opposite one another, again see *Maschinenteile* 1, page 75.

The smaller the peak-to-valley height and the average thickness of the intermediate space are chosen, the less viscous the glue used for gluing need be. The inventively determined upper limit of the peak-to-valley height and the average thickness of 0.3 µm determines an upper limit of the dynamic viscosity of the glue to be used, amounting to $10^3$ Pa·s at a temperature at which the glue for producing the glued connection spreads in planar fashion in the intermediate space between the surface regions.

Since, as a rule, glues have smaller dynamic viscosity at higher temperatures than at lower ones, glues that comprise, for example, a too-high dynamic viscosity for the inventive production of the glued connection at room temperature, would not be usable. However, these glues become usable for the production of this glued connection according to the present invention when used with an elevated temperature.

It is thereby advantageous that, as a rule, not only the dynamic viscosity of the glue but also its surface tension decreases so that the glue can penetrate more easily into the intermediate space with the small average thickness and can be spread out more easily therein.

Although in principle there is no lower limit to the dynamic viscosity of the liquid glue, for example in the vicinity of 1 mPa·s (viscosity of water or acetone), there is currently a practical lower limit at $10^2$ mPa·s, which, however, may be undershot in the future.

The invention does indeed include the case in which the surface regions that lie opposite one another and are provided for the production of the glued connection do not touch one another given the small average thickness of the intermediate space, but rather are arranged at a distance from one another, however, with respect to the cases that are currently the most significant in practice. It is useful to proceed in such a way that these surface regions are brought into intermediate contact with one another, whereby the planarly extended intermediate space with the small average thickness, which space is between these surface regions standing in contact with one another due to the existing roughness of these regions, remains, exhibiting a capillary action.

The inventive production of electrical and/or thermal contact connections by means of electrically insulating glue, to be discussed later, also belongs with these cases.

According to the invention, there are two variants for the bringing of the glue into the intermediate space with small average thickness as a result of capillary action.

In the more preferred variant of the invention, the intermediate space or spaces with small average thickness are first produced, without using glue, between the surface regions provided for the production of the glued connection, by setting the surfaces to be connected opposite one another. Thus, at first, no glue is located between these surfaces, so that it is also the case that all the existing intermediate spaces of small average thickness are free of glue.

Next, the liquid glue is first brought into the intermediate space. For this purpose, the glue is brought to an opening connected with such an intermediate space, from which this glue penetrates into the intermediate space due to capillary action and spreads out in the intermediate space in a planar fashion.

The opening can be, for example, a narrow opening of an intermediate space itself, which extends along an outer edge of the intermediate space and is as narrow as the average thickness of the intermediate space. However, it is more useful if this opening is a relatively larger opening that is connected with the intermediate space and through which the glue supplied can be brought in in a somewhat larger supply quantity than is used in the intermediate space.

In the other, less preferred variant of the invention, the glue is deposited on at least one of the surfaces to be connected in a quantity small enough that it covers this surface only partially and/or only partially covers a region of this surface provided for the production of the glued connection. Next, the surfaces to be connected are set opposite one another in such a way that surface regions that are allocated to one another and are provided for the production of the glued connection lie opposite one another, and these surfaces are then pressed against one another. A distance between these surface regions that is initially greater than that determined by the glue located between these surfaces is thereby reduced during the pressing of the surfaces against one another due to the glue distributing itself in a planar fashion between these surface regions as a result of capillary action, this reduction being of such extent that the intermediate space of small average thickness filled in a planar fashion with glue will occur between the surface regions. The glue is then hardened.

In this case, the capillary action is supported by a pressure additionally exerted on the glue.

It is noted that the invention also includes a method in which, for example, one or both surfaces to be connected are completely coated over their entire surface, or at least in a surface region, with a liquid glue, the surfaces coated in this way are set opposite one another, and then, through the pressing together of the surfaces, the glue is pressed out of the surfaces or surface regions, at least largely without exploiting the capillary action, until the intermediate space containing the glue and having the small average thickness of less than 0.3 µm occurs between the surface regions lying opposite one another and having the small peak-to-valley height of less than 0.3 µm. However, in this method, a comparatively larger quantity of glue must be used.

It is often the case that the surfaces to be connected comprise differences in shape, due to which a glued connection extending over a large surface region is not possible, because the intermediate space with the small average thickness between the surface regions that are opposite one another and are provided for the production of the glued connection is not possible over this larger surface region.

However, if the surfaces to be connected are elastically deformable, such differences in shape can be compensated by means of pressing together of the surfaces to be connected, and, between these surfaces, an intermediate space with the small average thickness can be produced between the surface regions set opposite to one another and provided for the production of the glued connection. The glued connection can be maintained at least during the spreading and the hardening of the glue in the intermediate spaces between these surfaces while under this pressure.

It is thereby advantageously sufficient if the surfaces to be connected are pressed against one another with a pressure of less than 1000 cN/mm². This pressure value is an upper limit. In practice, it has turned out that a pressure of less than 50 cN/mm² is sufficient for the pressing against one another of the surfaces to be connected.

The above pressure values also suffice in the above method, in which the glue is deposited on at least one of the surfaces to be connected before the placing opposite one another of the surface regions provided for the production of the glued connection.

As already noted above, it can be advantageous in several respects to carry out a spreading of the glue in the intermediate space with the small average thickness at a high temperature, including, in particular, a temperature greater than room temperature, which is 20° C.

Given thermally hardenable glues, care has to be taken with respect to the hardening temperature at which the glue hardens, so that the low dynamic viscosity required for spreading of the glue in the intermediate space with small average thickness as a result of pressure-supported or non-pressure-supported capillary action remains ensured.

It was already indicated above that it is useful to supply this thin liquid glue in somewhat larger quantities to the intermediate space with the small average thickness. It is also advantageous if the liquid glue is brought to the intermediate space through at least one duct that is connected by gluing to an intermediate space with small average thickness so that the duct is constructed in such a way that, due to the capillary action, the glue spreads more rapidly in this duct in comparison with the spreading speed of the glue in the intermediate space resulting from capillary action.

In addition, a duct can be used that merges with an opening into one of the surfaces to be connected and/or a duct that extends in a longitudinal direction parallel to a surface to be connected, with at least one longitudinal side that is connected with the intermediate space and from which the glue spreads into the intermediate space in the direction transverse to the longitudinal direction of the duct, as a result of capillary action.

An optically transparent glue is advantageously used, which is favorable, in particular in the production of glued connections to optical and/or optoelectronic components.

Although the use of electrically conductive glues is not excluded, an electrically insulating glue is preferably used in the present invention, particularly a glue based on epoxy resin.

The present invention is particularly well-suited for the production of electrical and/or thermal contacts. In this case, surface regions that are set opposite one another and are provided for the production of the glued connection consist of electrical contact surfaces and/or thermal contact surfaces.

The peak-to-valley height of the contact surface, which height is used in the present invention and is preferably comparatively particularly small, is thereby particularly advantageous if the contact surfaces are first brought into contact with one another, and the glue is only then brought into the remaining intermediate space between the contact surfaces, which are standing in the immediate contact with one another, by means of capillary action.

The particularly small peak-to-valley height ensures that a much greater percentage of the contact surface to be brought into immediate contact with one another are in direct contact with one another than is the case for larger peak-to-valley heights. By this means, very low electrical and/or thermal transitions resistances are obtained from the outset, which, in the electrical case, can be less than 1Ω·mm², and which are expected to be lowered still further in the future.

Since, due to the cited greater percentage, a comparatively smaller percentage of the surface is available for the glue in the inventive method, a mechanically less firm glued connection with poor durability is to be expected. However, the opposite has surprisingly turned out to be the case. Despite the circumstances supposed to be unfavorable, the inventive method achieves a sufficiently durable, mechanically firm glued connection.

In particular, contact surfaces made of gold have proved advantageous in the inventive method for the production of mechanically firm and durable glued connections. With a contact surface consisting of gold and a thin liquid glue based on epoxy resin, it was possible to obtain a very long-lasting, mechanically firm and temperature-resistant glued connection.

In particular, electrical and/or thermal contacts can be obtained of a quality that, for example, remains the same in temperature change tests between −40° C. and 85° C. with 500 cycles with one cycle per hour.

The surface regions can be provided by a layer of a predetermined material having a predetermined thickness. For example, a layer having an average layer thickness of at most 1 μm. It is desirable that a gap of at least 0.5 μm wide extends between two separate adjacent surface regions provided for the production of the glued connection. These surface layers can be arranged in a grid pattern having a spacing of at least 2 μm and can be used for a surface segment of a microelectronic and/or micromechanical or microoptical module that is used with each segment of the surface region in the form of surface contacts provided with the production of the glued connection. A surface segment of the substrate element is used, which segment is allocated to the contact surface of the surface segment of the module and comprises surface regions in the form of contact surfaces that are provided for the production of the glued connections.

The inventive method produces a mechanically firm glued connection between surfaces which have a layer made of a hardenable glue, which layer is formed in at least one intermediate space, which space is planar extending over an area of at least 20×20 μm² size and has an average thickness d of at most 0.3 μm between the surface regions facing one another and the surface regions respectively comprise a roughness with a small peak-to-valley height t of less than 0.3 μm and the layer extends over the entire intermediate space and connects the surface regions with one another. Preferably, the construction of the glued connection has one or several surface regions in the form of contact surfaces of the surface segments of a module selected from a microelectronic module, a micromechanical module and a microoptical module and one or several surface regions allocated respectively to one or several surface regions of a surface segment of the module in the form of contact surfaces of a surface segment of the substrate element, whereby the surface regions of the module and of the substrate element respectively occupy a surface of an area of at least 20×20 $\mu m^2$ size and comprise a peak-to-valley height of less than 0.3 $\mu$m.

Particular advantages of the invention include the fact that the average layer thickness of the glue layer effecting the connection is kept extremely thin through the use of the smallest quantities of glue, and the dosage and distribution of the liquid glue can be reduced by the use of ducts.

The surface to be connected can comprise only one or several surface regions, which are separated from one another and are respectively provided for the production of the inventive glued connection and have a small peak-to-valley height of less than 0.3 $\mu$m. One individual surface region of this sort can extend over the entire surface to be connected, in particular in such a way that it is identical with this surface. In the preferred construction, the surface regions are distributed on the relevant surface in a matrix form in rows and columns.

Other advantages and features of the invention will be readily apparent from the following description of the preferred embodiments, the drawings and claims.

DESCRIPTION OF THE PREFERRED EMBODIMENTS

Figure 1:
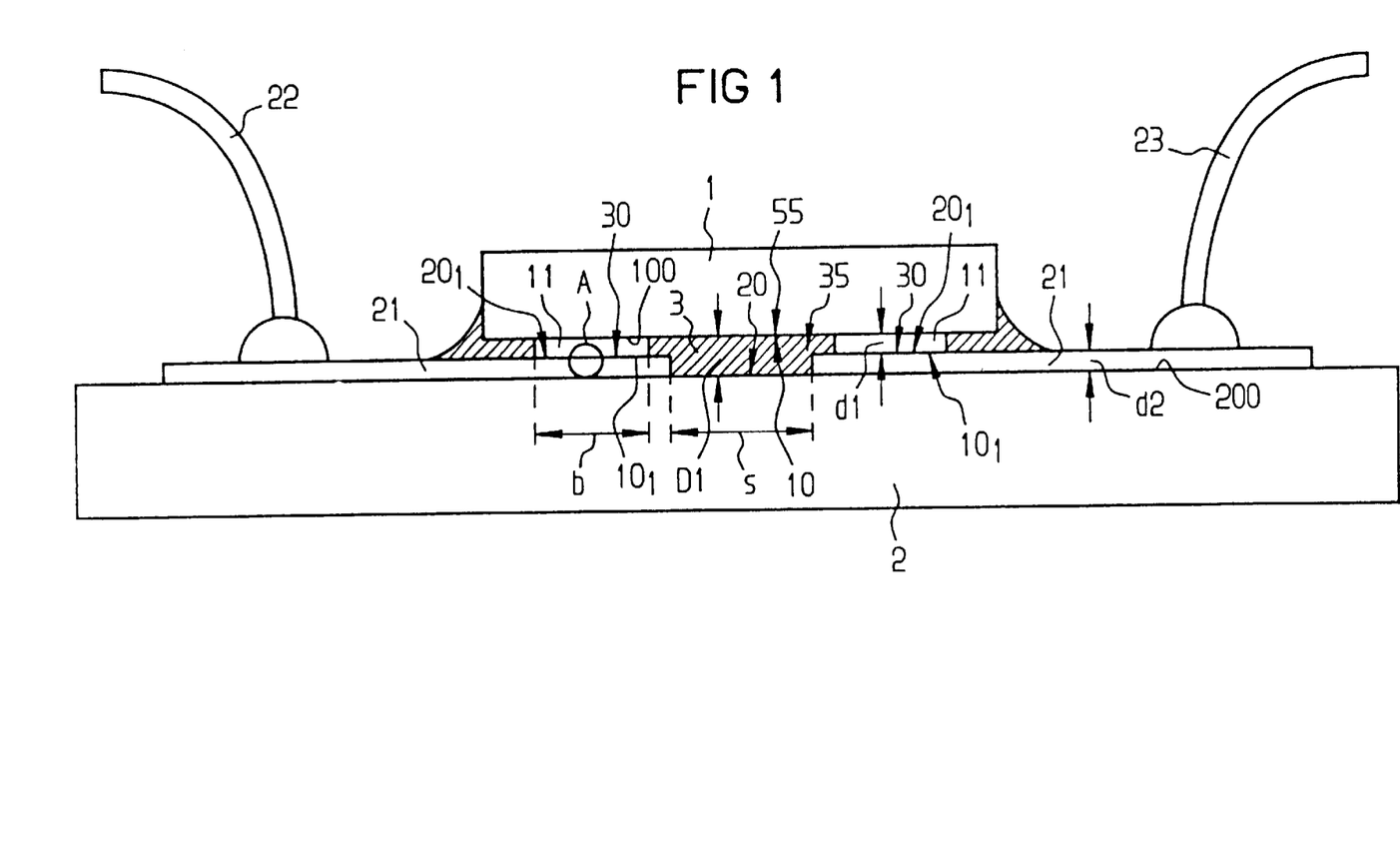
FIG. 1 is a side view with portions in cross section of an exemplary embodiment of the present invention showing two elements connected by the glued connection of the present invention.

The principles of the present invention are particularly useful when incorporated in a connection illustrated in FIG. 1. In the connection, an element 1 with a surface segment 100 and an element 2 with a surface segment 200 face one another. The surface segment 100 of the element 1 forms a flat side surface of this element, while the surface segment 200 of the element 2 forms a flat side surface of this other element 2, which may be a substrate.

Several layers 11, for example two layers separated from one another, are made of a particular material and have a particular layer thickness d1. The layers 11, which are arranged on the surface segment 100 of the element 1, with the parts of the surface segment 100 not covered by the layer 11 form a surface 10 for this element 1, which surface 10 is to be connected with another surface.

In the same way, on the surface segment 200 of the other element 2, there are arranged thereon, likewise, two layers 21 separated from one another and made of a certain material having a certain layer thickness d2, whose exposed surface, together with the parts left open on the surface segment 200 by the layers 21, form a surface 20 of this other element 2 that is to be connected with the surface $10_1$ of the first element 1. The surface 10, of each layer 11, which surface $10_1$ is offset from the surface segment 100 of the element 1 by the layer thickness d1 and is turned away from the surface segment 100, is of an area of at least 20×20 $\mu m^2$. The surface $10_1$ has a surface roughness of a peak-to-valley height of less than 0.3 $\mu$m and forms a surface region of the surface 10 to be connected that is provided for the production of the inventive glued connection. In a similar manner, the surface $20_1$ of each layer 21, which surface is offset from the surface segment 200 of the element 2 by the layer thickness d2, is turned away from the surface segment 200 and is of an area of at least 20×20 $\mu m^2$. This surface $20_1$ has a surface roughness of the inventive peak-to-value height of less than 0.3 $\mu$m and forms a surface region of the surface 20 to be connected that is provided for the production of the inventive glued connection.

For the production of the inventive glued connection, the surfaces 10 and 20 to be connected with one another are set opposite one another so as to face one another in such a way that at least one surface region 20, of the surface 20 of the element 2 lies opposite each surface region $10_1$ of the surface 10 of the element 1 and at least one surface region $10_1$ of the surface 10 of the element 1 lies opposite each surface region $20_1$ of the surface 20 of the element 2 so that a planarly extending intermediate space 30 respectively exists between each pair of surface regions $10_1$ and $20_1$. This intermediate space inventively comprises a small average thickness d of less than 0.3 $\mu$m and extends over an area whose size is at least 20×20 $\mu m^2$.

In this intermediate space 30, a thin liquid hardenable glue 3 is spread out in a planar fashion as a result of capillary action, which glue comprises a low viscosity of between $10^3$ and $10^2$ mPa·s at a temperature T at which the spreading out takes place. As a rule, the viscosity of this glue decreases as the temperature increases. For this reason, a glue whose viscosity is too high at a given temperature, for example room temperature, can, at a higher temperature, have a viscosity that is sufficiently lower so that the glue can spread out in the intermediate space 30 at this higher temperature. In such a case, the spreading of the glue in the intermediate space 30 is carried out at this higher temperature. Since, as a rule, the surface tension of the glue decreases with the increasing temperature, at least within a certain limit, the use of a higher temperature can be advantageous.

After the intermediate space 30 has been sufficiently, for example completely, filled with the thin liquid layer 3, the glue 3 is hardened, producing the inventive glued connection. The hardening can be different depending on the type of glue used. With thermally hardenable glues 3, for example, the hardening takes place at a particular hardening temperature.

Figure 2:
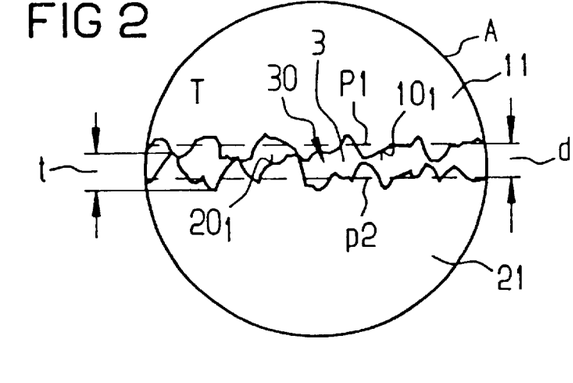
FIG. 2 is an enlarged segment encompassed by a circle A of FIG. 1, wherein the surface regions provided for the production of the glued connection are in contact with one another and the glue located therebetween is still in a liquid and not hardened form.

As shown in FIG. 2, the intermediate space 30 is located between the two opposite surface regions $10_1$ and $20_1$ of the two layers 11 and 21 allocated to one another. Each of these surface regions $10_1$ and $20_1$ comprise a roughness with a small peak-to-valley height t of less than 0.3 µm. In practice, the peak-to-value height t is often well under 0.3 µm. Typical values of the peak-to-valley height t lie between 5 nm and 30 nm according to the present invention.

The average profile of the surface region $10_1$ is represented by the broken lines p1, and the average profile of the surface region $20_1$ is represented by the broken lines p2. The average thickness d of the intermediate space 30 is defined by the spacing d between the two average profiles p1 and p2. According to the invention, this spacing is smaller than 0.3 µm. In practice, the average thickness d often lies well below 0.3 µm. According to the invention, typical values of the average thickness are 50 mn.

In FIG. 2, it is assumed that the intermediate space 30 is filled with a glue 3 that is still liquid, which has spread out in the intermediate space 30 at a preselected temperature T as a result of capillary action.

In addition, in the example according to FIG. 2, it is not necessarily assumed that the two surface regions $10_1$ and $20_1$ were brought into immediate contact with one another while the glue was still absent, and that the thin liquid glue 3 was not supplied to the intermediate space 30 until afterwards, after which it spread out in planar fashion in this intermediate space due to the capillary action. Accordingly, in this case, the intermediate space 30 has a small average thickness d of less than 0.3 µm from the outset, for example before the introduction of the glue 3.

Figure 3:
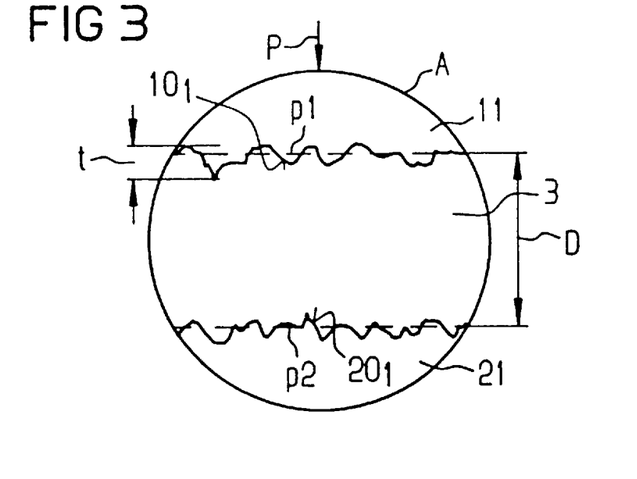
FIG. 3 is an enlarged segment similar to FIG. 2, wherein the surface regions are not in contact with one another but rather arranged at a greater distance from one another and the glue located between them is in a liquid and not hardened form.

If in contrast a small quantity of the glue is deposited on at least one of the two surfaces 10 and 20 to be connected before they are brought together, this small quantity of glue first results in a spacing D between the opposed surface regions $10_1$ and $20_1$ that is larger in comparison with the average thickness d as shown in FIG. 3. By means of pressing together the two elements 1 and 2, and thereby the two surface regions $10_1$ and $20_1$, with a predetermined pressure P, this larger spacing D is reduced so that the planarly extending intermediate space 30, which has a small average thickness d and is filled with the thin liquid glue 3, occurs between these surface regions $10_1$ and $20_1$. During this pressing together, the thin liquid 3 is distributed in a planar fashion between the surface regions $10_1$ and $20_1$ due to pressure-supported capillary action.

Also, in this method, after the production of the small average thickness d of the intermediate space 30, the surface regions $10_1$ and $20_1$ lying opposite one another can be in immediate contact with one another, as in the case shown in FIG. 2. However, regardless of which of the two methods indicated above is used, the invention also includes those cases in which the opposed surface regions $10_1$ and $20_1$ are not in contact with one another at the small average thickness d, for example in the case shown in FIG. 3 in which, however D would be replaced by d. For example, but not necessarily, this could be the case if the peak-to-valley height t were significantly smaller than the small average thickness d.

Figure 4:
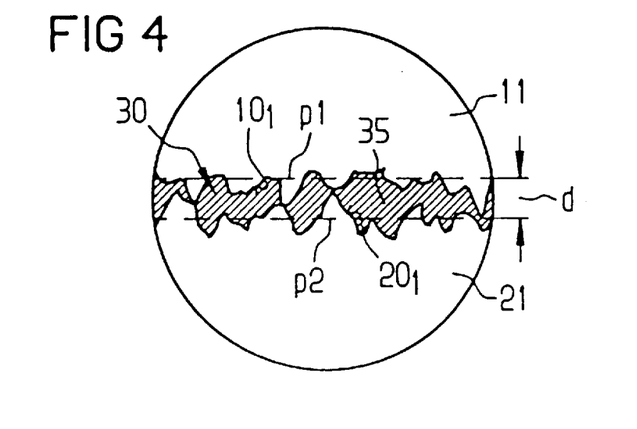
FIG. 4 is an enlarged segment similar to FIG. 2 with the same assumption of the intermediate contact of the surface regions with one another and the glue in the hardened form.

After the hardening of the thin liquid glue 3, which is spread out in a planar fashion in the intermediate space 30, there occurs, in each case, a layer 35 (see FIG. 4) of hardened glue that extends over the entire intermediate space 30 and that connects the surface regions $10_1$ and $20_1$ with one another.

If, in the production of the glued connection, the surface regions $10_1$ and $20_1$ allocated to one another are positioned opposite one another without glue, thus between these surface regions $10_1$ and $20_1$, on the basis of which there remains the planarly extending intermediate space 30 that has the small average thickness d and exhibits a capillary action, it is useful to supply the glue 3 to an opening 55 connected with the intermediate space 30, from which opening the glue 3 penetrates into the intermediate space 30 due to the capillary action and spreads out in a planar fashion in the intermediate space 30.

Figure 8:
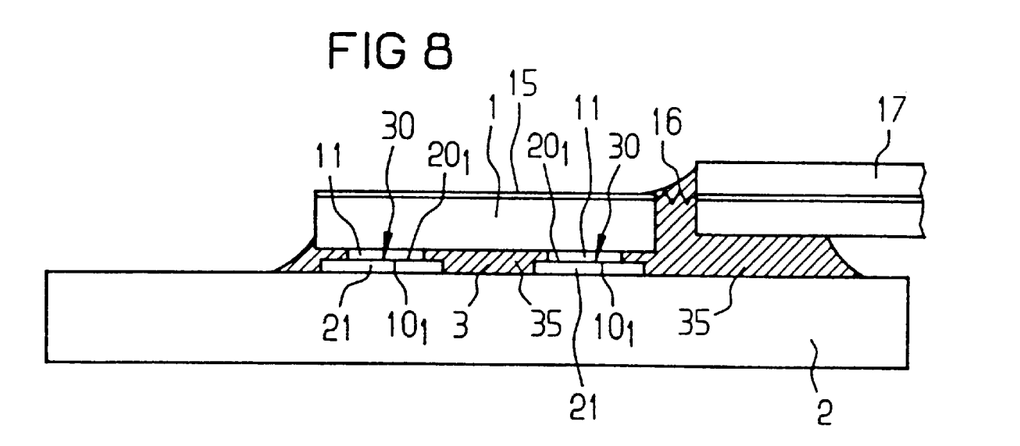
FIG. 8 is a side view with portions in cross section showing a third modification of the glued connection of FIG. 1.

In the case of the example according to FIGS. 1 and 8, an opening 55 of this sort is defined by the space located between two pairs of layers 11 and 21 opposite one another and the surface regions 100 and 200 arranged at a spacing D1 from one another, whereby the spacing D1 is, as a rule, larger than the average thickness d of the intermediate space 30.

The spacing D1 is often predetermined to be small enough that, in the space defined by it, the thin liquid glue 3 spreads out with a spreading speed comparable to a given spreading speed of the glue 3 in the intermediate space 30 with the small average thickness d due to the capillary action. Thus, with a slowness similar to that in the intermediate space 30, the glue 3 can be supplied to the intermediate space 30 very slowly.

Figure 5:
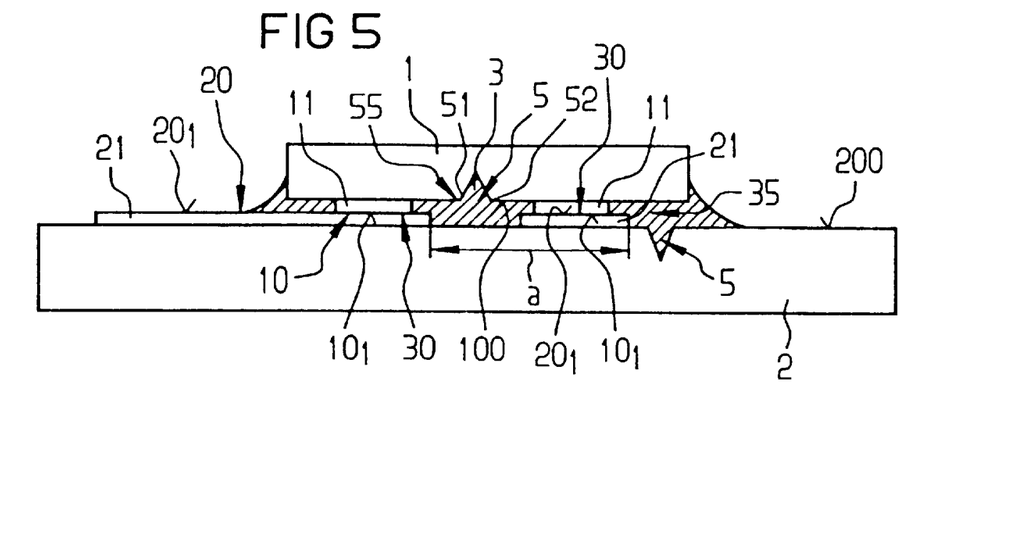
FIG. 5 is a side view with portions in cross section of a first embodiment of the inventive glued connection of FIG. 1.
Figure 6:
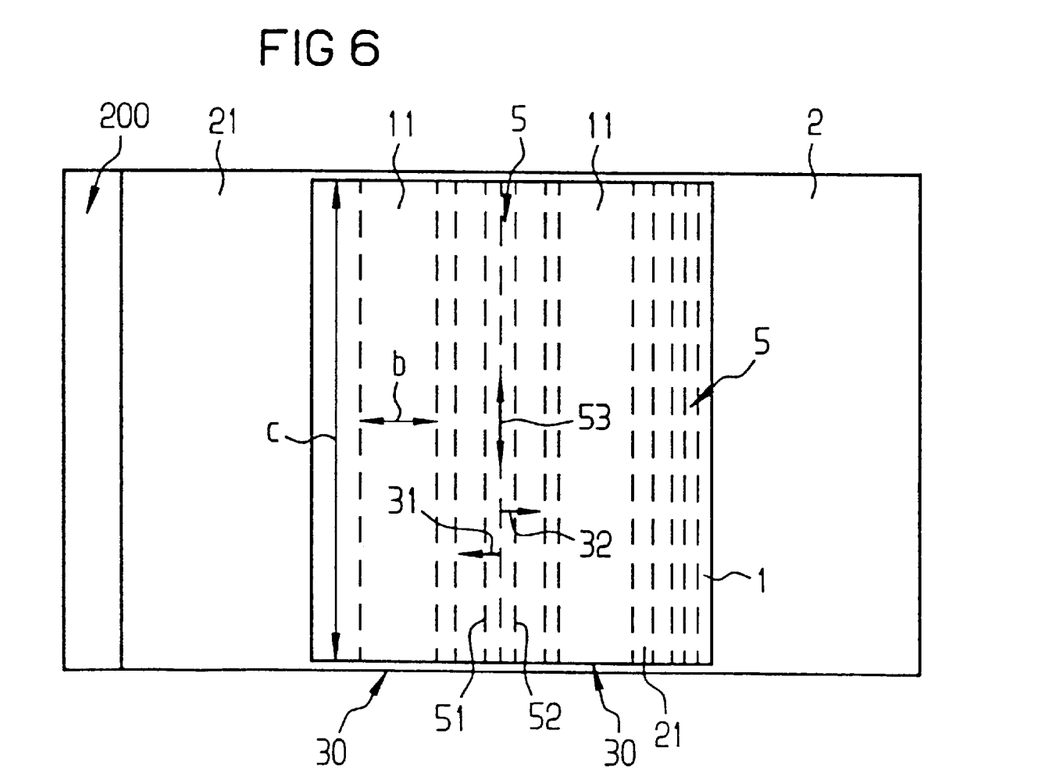
FIG. 6 is a top plan view of the embodiment of FIG. 5.
Figure 7:
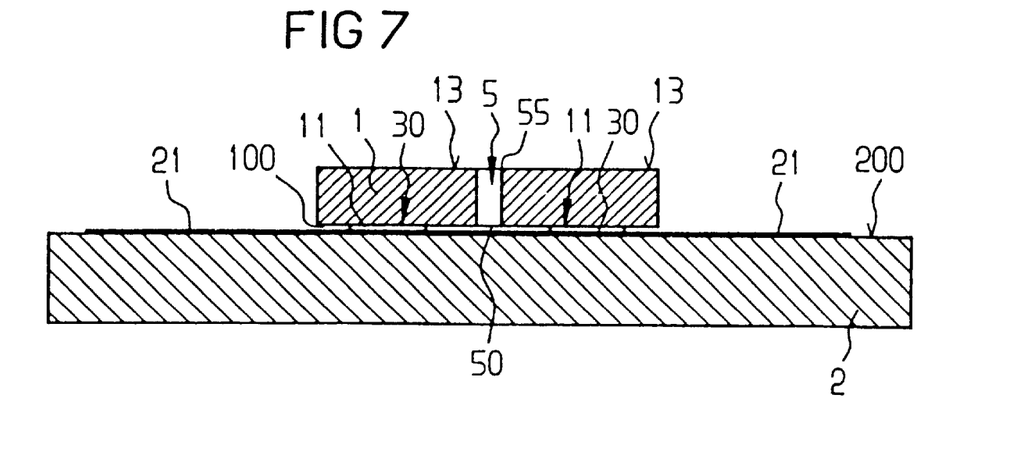
FIG. 7 is a cross sectional view of a second modification of the glued connection of FIG. 1.

This can be aided by bringing the thin liquid glue 3 to the intermediate space 30 through at least one duct 5, such as illustrated in FIGS. 5–7. The duct is connected and provides glue to the intermediate space 30 having small average thickness d. The duct is dimensioned in such a way that the glue 3 in the duct spreads more rapidly in relation to a given spreading speed of the glue 3 in the intermediate space 30 due to capillary action.

An advantageous feature is, for example, a duct 5 according to FIGS. 5 and 6, which extends in a longitudinal direction 53 parallel to the surfaces 10 and 20 to be connected and has at least one longitudinal side 51 and/or 52 that is connected with an allocated intermediate space 30 and from which the glue 3 spreads into the intermediate space 30 in the direction 31 or, respectively, 32 transverse to the longitudinal direction 53 of this duct due to capillary action. The duct 5 of this sort can be fashioned in the element 1 or in the element 2. In the example shown, a duct 5 is realized by a V-shaped groove formed in the surface segment 100 of the element 1 and/or the surface segment 200 of the element 2, which groove can, for example, be produced by anisotropic etching.

According to the embodiment of FIG. 6, the duct 5 extends, for example, over the entire width c of the element 1, as does each surface region $10_1$ and $20_1$ provided for the production of the inventive glue connection, and thereby each intermediate space 30. The measured width perpendicular to this width c of the narrower layer 11 of two layers 11 and 21 lying opposite one another is designated b. In this example, the surface b×c of this narrow layer 11 substantially determines the surface or area of the intermediate space 30 with an average thickness d between the surface regions $10_1$ and $20_1$ lying opposite one another. According to the invention, b×c must be selected larger than 20×20 µm, and each of these surface regions $10_1$ and $20_1$ must comprise at least this surface. In principle, there is no upper limit for the size of the surface of the intermediate space 30.

As an alternative to the duct of the embodiment according to FIGS. 5 and 6, or in addition thereto, a duct 5 can be used that merges from an opening 50 into the surface 10 or 20 to be connected. FIG. 7 shows an example of such a duct 5 that merges with the opening 50 and discharges onto the surface of the element 1 and connects this opening 50 with an opening 55, which extends from the side 13 of the element 1, which is facing away from the surface 10, to which opening 55 the thin liquid glue 3 is to be supplied.

Given elastically deformable surfaces 10 and 20 to be connected, relative differences in shape can be compensated by means of pressing together of these surfaces 10 and 20 with a pressure P, and in this way, a previously non-existing intermediate space 30 with a small average thickness d can be produced between surfaces $10_1$ and $20_1$, which are opposed to one another, and which regions are provided for the production of the glued connection. This pressing together occurs at least during the spreading and hardening of the glue in the produced intermediate space 30 between the surface regions $10_1$ and $20_1$. For the pressing together of the surfaces 10 and 20 to be connected, a pressure P of less than 1000 cN/mm$^2$ is sufficient and, in most cases, this pressure can even be less than 50 cN/mm$^2$.

In the examples shown in the Figures, the element 1 is a microelectrical and/or micromechanical and/or a microoptical module, whose layers 11 arranged on its surface segment 100 are contact layers made of an electrically conductive material, so that the surface regions 10, provided for the production of the inventive glued connection are electrical contact surfaces. The element 2 is a substrate element for contacting and mounting the module 1, whose layers 21 arranged on its surface segment 200 are likewise contact layers made of electrically conductive material, so that in this element 2, it is also the case that the surface regions 20, provided for the production of the inventive glued connection are electrical contact surfaces.

In the example according to FIG. 1, the two present contact layers 21 of the element 2, which are connected with a respective one contact layer 11 of the element 1, are connected with electrical contact wires 22 and 23 for the supplying and/or transmission of electrical energy or signals. This connection of the wires 22 and 23 to the respective layers 21 is, for example, by soldering or bonding.

In the example according to FIG. 8, the optoelectronic module 1 comprises, for example, a laser diode 15 or another semiconductor light source whose radiated light 16 is coupled into an optical fiber 17 fastened on the substrate element 2. For the fixing of the module 1 on the substrate element 2 by means of the inventive glued connection and fixing of the fiber 17 on the element 2, one and the same optically transparent thin liquid glue 3 is used, which, in the hardened state, advantageously forms a glue layer 35 that is transparent for the light 16, which layer is thinner than 0.1 μm in each intermediate space 30.

The thin liquid glue 3 used in the production of electrical contacts is preferably an electrically insulating glue. In particular, a thin liquid epoxy-based glue 3 has proven advantageous. When the contact layers 11 and 21 are made of gold, the epoxy-based glue imparts a particularly good adhesion and thereby enables particularly low electrical transition resistance of less than 1 mΩ·mm$^2$, despite its electrically insulating effect, and, in addition, the glue is optically transparent. Good thermal contacts can also be produced.

The average layer thickness d1 of each layer 11 of the element 1 and the average layer thickness d2 of each layer 21 of the layer 2 should be 1 μm at most, whereby the average layer thickness d1 or, respectively, d2, here, also relates to the average profile.

A gap s (see FIG. 1) of at least 0.5 μm width should be maintained between each of the two adjacent surface regions $10_1$ and $10_1$ or, respectively, $20_1$ and $20_1$ of each element 1 or, respectively, element 2.

Two or more separate surface regions $10_1$ or, respectively $20_1$, provided for the production of the inventive glued connection, should be arranged on the surface 10 or 20, respectively, to be connected with a contact spacing or grid dimension a (see FIG. 5) of at least 2 μm. The term "contact spacing" thereby refers not only to the contact spacing a shown in FIG. 5 in the direction of the width b (see FIGS. 1 and 6), but rather also includes, especially in the case of matrix-type arrangement of the surface regions $10_1$ and/or $20_1$ on the surface 10 or, respectively, the surface 20 to be contact spacings in the direction c of FIG. 1, which can be equal to the contact spacing a in the direction b or can be different from it.

With the inventive method, hybrid optical or electrical modules can be easily produced.

Although various minor modifications may be suggested by those versed in the art, it should be understood that we wish to embody within the scope of the patent granted hereon all such modifications as reasonably and properly come within the scope of our contribution to the art.

We claim:

1. A method for producing mechanically firm glued connections between opposing surfaces, which surfaces are to be connected by use of a planar surface region of each surface extending over the surface and having a roughness with a small peak-to-valley height, said method comprising the steps of providing two elements with surfaces with planar surface regions having a surface roughness with a small peak-to-valley height t of less than 0.3 μm, one of the two elements being a module selected from a group consisting of microelectronic modules, micromechanical modules and microoptical modules, the surface regions of the one element being a contact surface of a surface segment of the module, and the surface region of the other element of the two elements being a contact surface of a surface segment of a substrate, positioning the surface regions of the two surfaces opposite one another with a spacing between the surface regions extending planarly over the surface regions to form an intermediate space having a small average thickness d of less than 0.3 μm and with an area having a size of at least 20×20 μm$^2$, introducing a hardenable liquid glue having a low dynamic viscosity in the intermediate space, utilizing a capillary action to spread the thin liquid glue in a planar fashion and then hardening the glue contained in the intermediate space while maintaining the small average thickness d of the intermediate space to form the mechanically firm glued connection between the surfaces.

2. A method according to claim 1, wherein the introducing of the glue provides a glue having a dynamic viscosity of at most 10$^3$ mPa·s at a predetermined temperature at which the glue spreads out in a planar fashion in the intermediate space.

3. A method according to claim 1, wherein the step of introducing the glue includes providing an opening connected with the intermediate space, and introducing the glue into the opening from which the glue penetrates into the intermediate space.

4. A method according to claim 1, wherein the surfaces to be connected are elastically deformable and, for compensation of differences of the shape between the surfaces, the method includes pressing the surfaces regions against one another for the purpose of producing and maintaining an intermediate space with the small average thickness d between the surface regions that are opposed to one another, said pressing occurring at least during the spreading out and hardening of the glue in the intermediate space between the surface regions.

5. A method according to claim 4, wherein the surfaces to be connected are pressed against one another with a pressure less than 1000 cN/mm$^2$.

6. A method according to claim 5, wherein the surfaces to be connected are pressed against one another with a pressure less than 50 cN/mm$^2$.

7. A method according to claim 1, wherein the step of introducing the glue includes spreading out the liquid glue in the intermediate space with a small average thickness d and maintaining a temperature greater than 20° C. during this step.

8. A method according to claim 1, wherein the step of introducing the liquid glue provides at least one duct for the glue connected to the intermediate space, which has the small average thickness d and the step of introducing the glue introduces the glue through the duct, where it will spread more quickly in comparison to a given spreading speed of the glue in the intermediate space due to the capillary action.

9. A method according to claim 8, wherein the duct is an opening extending through one of the two elements and discharging into a space between the two surfaces of the two elements.

10. A method according to claim 8, wherein the duct extends in the longitudinal direction parallel to the two surfaces to be connected and has at least one longitudinal side that is connected with an intermediate space and from which the glue spreads out into the intermediate space in a direction extending transverse to the longitudinal direction of the duct as a result of the capillary action.

11. A method according to claim 1, wherein the step of introducing the glue introduces an optically transparent glue.

12. A method according to claim 1, wherein the step of introducing the glue introduces an electrically insulating glue.

13. A method according to claim 12, wherein the electrically insulating glue is an epoxy-based glue.

14. A method according to claim 1, wherein the positioning of the surface regions set the regions opposite one another and bring the regions into immediate contact with one another, wherein, due to the existing roughness, the planarly extending intermediate space is provided.

15. A method according to claim 14, wherein the step of providing the two elements with contact surfaces provides electrical contact surfaces on the one elements, and said step of providing a glue includes providing electrically insulating glue.

16. A method according to claim 15, wherein the step of providing the contact surfaces provides gold contact surfaces.

17. A method according to claim 15, wherein the step of providing contact surfaces on the elements provides more than two surface regions, with each of the surface regions having an area of at least 20×20 $\mu$m and a roughness of a small peak-to-valley height of less than 0.3 $\mu$m, said step of positioning positions the surface regions set opposite one another in such a way that the surface regions allocated to one another lie opposite one another and a planarly extending intermediate space is respectively produced between each pair of surface regions lying opposite one another, which intermediate space extends over an area of a size of at least 20×20 $\mu$m and comprises a small average thickness d of less than 0.3 $\mu$m.

18. A method according to claim 17, wherein the step of providing more than one surface region on each of the surfaces provides a gap of at least 0.51 $\mu$m wide between two separate adjacent surface regions which are used to provide for the glued connections.

19. A method according to claim 17, wherein the step of providing surfaces to be connected provides at least two separate surface regions on each surface with a contact spacing of at least 2 $\mu$m between the surface regions.

20. A method according to claim 14, wherein the step of providing the two elements with the surfaces provides thermal contact surfaces and said step of introducing glue includes introducing an insulating glue.

21. A method according to claim 1, wherein the surface regions to be connected are defined by a layer of a predetermined material deposited on an area of a size of at least 20×20 $\mu$m$^2$ of the surface of each element and each of the layers have a surface with a roughness with a small peak-to-valley height of less than 0.3 $\mu$m and to form the surface region.

22. A method according to claim 21, wherein the layer is used having an average layer thickness of almost 1 $\mu$m.

23. A method for producing mechanically firm glued connections between opposing surfaces, which surfaces are to be connected by use of a planar surface region of each surface extending over the surface and having a roughness with a small peak-to-valley height, said surface regions having an area with a size of at least 20×20 $\mu$m$^2$ and a spacing between the regions of the opposing surfaces of a small average thickness d of less than 0.3 $\mu$m, said method comprising the steps of providing two elements with surfaces with a planar surface region having a surface roughness with a small peak-to-valley height t of less than 0.3 $\mu$m, one of the two elements being a module selected from a group consisting of microelectronic modules, micromechanical modules and microoptical modules and the surface region of the other element of the two elements being a substrate, placing a deposit of a hardenable liquid glue having a low viscosity on at least one of the surface regions in a small enough quantity that it will only partially cover the surface region, then positioning the surface regions opposite one another and pressing the regions together in such a way that there results between these surface regions a spacing D that is determined by the glue located between these surface regions and that is greater than the small average thickness d, continuing the pressing until the glue is distributed in a planar fashion between the surface regions to reduce the thickness of a glue layer to the small average thickness d, and then hardening the glue layer while maintaining the small average thickness d of the layer to form the mechanically firm glued connection between the surfaces.

24. A mechanically firm glued connection between surfaces comprises a first element connected to a surface of a second element, said elements having planar surface regions of an area of a size of at least 20×20 $\mu$m$^2$ and a layer of hardened glue extending therebetween having an average thickness of not more than 0.3 $\mu$m between the surface regions which are facing one another to be connected, said surface regions respectively having a roughness with a small peak-to-valley height of less than 0.3 $\mu$m and said layer extending over a space connecting the surface regions with one another, the surface region of the first element being a contact surface of a surface segment of a module selected from a group consisting of microelectronic modules, micromechanical modules and microoptical modules and the surface region of the second element being a contact surface of a surface segment of a substrate.

* * * * *